(12) United States Patent
Falck et al.

(10) Patent No.: US 7,880,260 B2
(45) Date of Patent: Feb. 1, 2011

(54) SEMICONDUCTOR DEVICE WITH A SEMICONDUCTOR BODY AND METHOD FOR ITS PRODUCTION

(75) Inventors: Elmar Falck, Ottobrunn (DE); Josef Bauer, Markt Indersdorf (DE); Gerhard Schmidt, Wernberg (AT)

(73) Assignee: Infineon Technology Austria AG, Villach (AT)

( * ) Notice: Subject to any disclaimer, the term of this patent is extended or adjusted under 35 U.S.C. 154(b) by 235 days.

(21) Appl. No.: 12/107,335

(22) Filed: Apr. 22, 2008

(65) Prior Publication Data

US 2009/0261379 A1    Oct. 22, 2009

(51) Int. Cl.
*H01L 23/58* (2006.01)
(52) U.S. Cl. ............... 257/490; 257/496; 257/171; 257/263; 257/493; 257/E29.012; 257/E29.262; 438/527; 438/140
(58) Field of Classification Search ........... 257/490, 257/496, 171, 263, 493, E29.012, E29.262; 438/527, 140
See application file for complete search history.

(56) References Cited

U.S. PATENT DOCUMENTS

2006/0197159 A1* 9/2006 Schmidt .................. 257/354

2007/0272979 A1* 11/2007 Saito et al. .................. 257/335

FOREIGN PATENT DOCUMENTS

DE    10238797    3/2004

OTHER PUBLICATIONS

Stengl et al., Variation of lateral doping as a field terminator for high-voltage power devices, IEEE Xplore, 2008, 1 page.

* cited by examiner

*Primary Examiner*—Tu-Tu V Ho
(74) *Attorney, Agent, or Firm*—Dicke, Billig & Czaja, PLLC

(57) ABSTRACT

A semiconductor device includes an active region with a vertical drift path of a first conduction type and with a near-surface lateral well of a second, complementary conduction type. In addition, the semiconductor device has an edge region surrounding the active region. This edge region has a variable lateral doping material zone of the second conduction type, which adjoins the well. A transition region in which the concentration of doping material gradually decreases from the concentration of the well to the concentration at the start of the variable lateral doping material zone is located between the lateral well and the variable lateral doping material zone.

5 Claims, 4 Drawing Sheets

SEMICONDUCTOR DEVICE WITH A SEMICONDUCTOR BODY AND METHOD FOR ITS PRODUCTION

BACKGROUND

The application relates to a semiconductor device with a semiconductor body and to a method for producing a semiconductor device.

A semiconductor device may include an active region with a vertical drift path of a first conduction type and with a near-surface lateral well of a second, complementary conduction type. In addition, the semiconductor device has an edge region surrounding the active region.

This edge region has a variable lateral doping material zone of the second conduction type, which is also known as a VLD structure (variation of lateral doping zone). This VLD structure or VLD zone adjoins the well. In this type of connection, the concentration of doping material is abruptly reduced from the concentration of the well to the concentration of the VLD structure by approximately 1.5 to 2.5 powers of ten. After this, the variable concentration of doping material is gradually reduced to the drift path concentration along a preset lateral length.

An edge structure of this type provides an improved field distribution in a VLD zone for such semiconductor devices which has been optimised in static terms. This, however, changes drastically during the fast dynamic switching of the semiconductor device. When a power semiconductor device through which a current flows is switched off, the charge carrier plasma in the semiconductor device is degraded by the extraction of holes and electrons, leading to the development of a space charge zone at the anode-side $p^+$-$n^-$ junction after a critical period of time.

In particular, when switching with large current rise rates, the concentration of free holes in this space charge zone may become comparable to or even higher than the basic doping of the base zone. This increases the gradient of electric field strength from the drift zone to the complementary-doped well and to the complementary-doped VLD structure, so that the critical electric field strength required for avalanche breakdown can be reached at device voltages which are significantly less than the static breakdown voltage.

To improve semiconductor devices of this type in dynamic terms as well, the robustness of the semiconductor device can be increased by reducing the concentration of free charge carriers in the edge region using known measures. This reduction can for example be achieved by locally reducing the life of the charge carriers, for instance by irradiation with electrons or light ions, in particular protons or helium ions. A further possible method is based on reducing the injection of free charge carriers from the highly doped outer zones in the edge region.

For this purpose, the concentration of the $n^+$-emitter in the edge region is for example reduced in the case of a diode, or the concentration of the $p^+$-collector is reduced in the case of an IGBT. In semiconductor devices with a VLD structure in the edge region it has, however, been found that the critical point in fast dynamic switching lies in the transition region between a complementary-doped well and the VLD zone. At these points—in contrast to the behaviour under static blocking loads—certain hard switching conditions may lead to an excessive field peak far above the critical field strength. This results in a massive generation of additional charge carrier pairs by impact ionization, which are separated by the high electric field.

For these and other reasons, there is a need for the present invention.

SUMMARY

A semiconductor device with a semiconductor body includes an active region with a vertical drift path of a first conduction type and with a near-surface lateral well of a second, complementary conduction type. In addition, the semiconductor device has an edge region surrounding the active region. This edge region has a variable lateral doping material zone of the second conduction type, which adjoins the well. Between the lateral well and the variable lateral doping material zone, there is a transition region wherein the concentration of doping material is gradually reduced from the concentration of the well to the concentration at the start of the variable lateral doping material zone.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
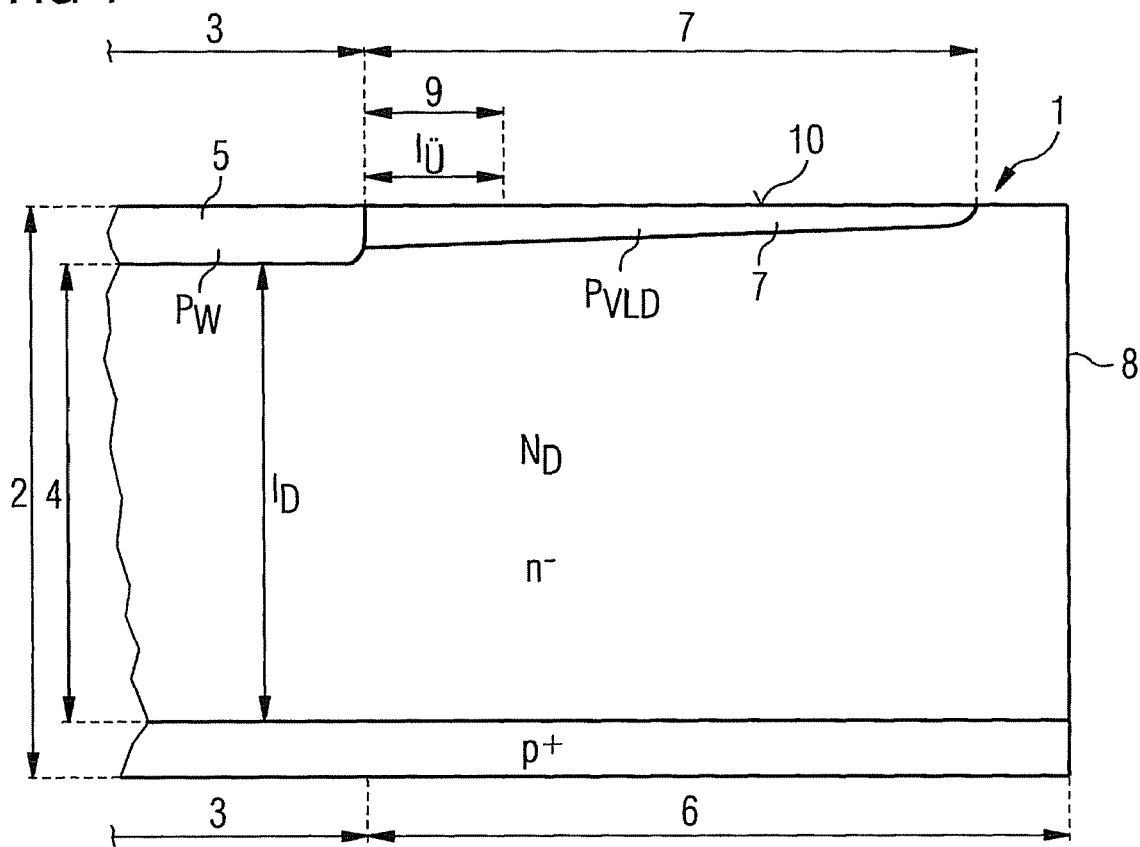
FIG. 1 illustrates a diagrammatic cross-section through a section of a semiconductor device according to an embodiment.

FIG. 1 illustrates a diagrammatic cross-section through a section of a semiconductor device 1 according to an embodiment. In this embodiment, the semiconductor device 1 includes within a semiconductor body 2 an active region 3 with a vertical drift path 4 of a first n-conduction type and with a lateral well 5 of a second, complementary p-conduction type near the surface. An edge region 6 surrounds this active region 3 and has a variable lateral doping material zone 7 hereinafter referred to as VLD structure or VLD zone.

This VLD zone is also of the second, complementary p-conduction type and adjoins the well 5. The concentration of doping material $P_{VLD}$ of the VLD zone is reduced to the concentration of doping material $N_D$ of the drift zone 4 along the VLD zone 7 towards a semiconductor edge 8. A transition region 9 is provided between the lateral well 5 and the VLD zone 7, wherein the concentration of doping material $P_{\ddot{U}}$ gradually reduces from the concentration of doping material $P_W$ of the well 5 to the concentration of doping material $P_{VLD}$ of the variable lateral doping material zone 7.

Figure 2:
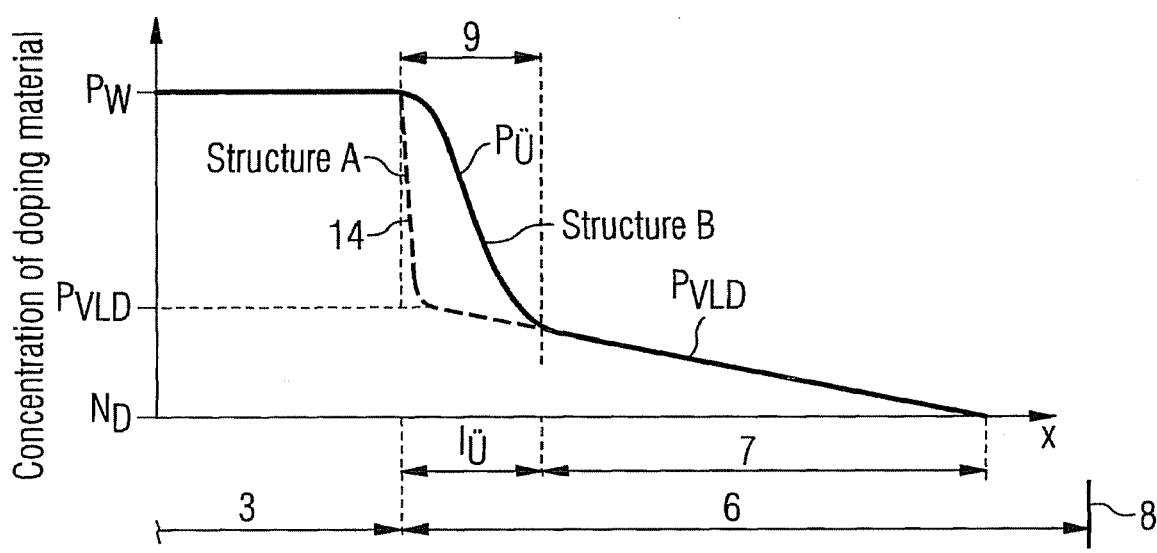
FIG. 2 diagrammatically illustrates the behaviour of the doping material profiles of the semiconductor device in the section according to FIG. 1.

As FIG. 2 illustrates, the concentration of doping material $P_{\ddot{U}}$ in the transition region 9 is gradually reduced within a lateral length $l_t$ by, for example, 1.5 to 6 powers of ten. In conventional structures A for the variable lateral doping material zone 7, there is an abrupt reduction at the transition from the concentration of doping material $P_W$ of the well 5 to the concentration of doping material $P_{VLD}$ as illustrated in FIG. 2. This does not pose a great problem in static switching processes. In dynamic switching processes, however, the above critical effects can be triggered.

In the structure B, a concentration profile of doping material as illustrated in FIG. 2 is created in the transition region 9 on a length $l_{\ddot{U}}$. In the transition region 9, the concentration of doping material $P_{\ddot{U}}$ is moderately and gradually reduced from the concentration of doping material $P_W$ of the well 5 to the concentration of doping material $P_{VLD}$ as illustrated in the diagrammatic concentration profile of the region according to FIG. 1, which is illustrated in FIG. 2. The lateral length $l_{\ddot{U}}$ of the transition region 9 is for example calculated with reference to the reverse voltage class of the semiconductor devices.

The blocking voltage class is closely related to the length $l_D$ of the drift path 4 of the semiconductor device 1. The relationship between the lateral length $l_{\ddot{U}}$ of the transition region 9 and the vertical length $l_D$ of the drift path 4 may for example be $0.1 \leq l_{\ddot{U}}/l_D \leq 0.5$, i.e. in the semiconductor device, the length $l_{\ddot{U}}$ of the transition region 9 is between 10% and 50% of the drift path length $l_D$ from the p-type well 5 to the VLD zone 7. This enables the p-type well 5 to diffuse out very strongly in the lateral direction, i.e. with a lateral diffusion zone length of approximately 100 µm in contrast to the previous 6 µm in semiconductor devices of the reverse voltage class 6.5 kV.

This can for example be achieved by using a suitable photoresist technology for the p-type well 5. A suitable method for the production of such a semiconductor device 1 with a gradual transition region 9 of the concentration of doping material $P_W$ from a complementary-conducting well 5 to a complementary-conducting VLD zone may for example include the following process processes. First, a lightly doped semiconductor wafer of a first n-conduction type and a concentration of doping material between $10^{12}$ cm$^{-3}$ and $10^{14}$ cm$^{-3}$ is provided, which may for example be produced homogeneously by neutron bombardment of a non-doped semiconductor body. The complementary-conducting well 5 and the transition region 9 are then processed in a first photomask process. For this purpose, a first photoresist mask is applied to the front side 10 of the semiconductor wafer to cover the edge region while leaving the active region exposed for the introduction of a complementary-conducting well 5. Towards the semiconductor chip edges, this first photoresist mask has hole structures for a transition region 9 to the edge region surrounding the active region with the well 5. These hole structures represent doping material windows, which have a higher density towards the active region. The first photoresist mask forms a mask for a subsequent ion implantation of a second p-conduction type complementary to the first n-conduction type into the semiconductor surface 10 of the semiconductor wafer while forming the p-type well 5 in the active region 3 of the semiconductor device 1 to be produced and while forming islands of doping material for a transition region 9 towards the edge region. During a subsequent diffusion process of the complementary doping material, the complementary-conducting well 5 in the active region 3 and at the same time, by lateral diffusion of the islands of doping material, the transition region 9 towards the edge region are produced within a lateral length $l_{\ddot{U}}$. In a second photomask process, the complementary-conducting VLD zone 7 is then processed. For this purpose, a second photoresist mask is applied to the front side 10 of the semiconductor wafer. This second photoresist mask has hole structures towards the semiconductor chip edges in the edge region, which increase in density towards the active region. Similar to the first photomask process, the complementary-conducting VLD zone 7 is then produced by ion implantation of a second p-conduction type complementary to the first n-conduction type, followed by diffusion.

Simulations of an edge structure produced in this way illustrate that the field strength at the previously critical point at the transition from the p-type well 5 to the VLD zone 7 is reduced to less than half. This reduces the risk that positive holes develop along the semiconductor surface towards the anode contact and at the same time electrons no longer flow in the direction of the back side contact at current densities of a 6.5 kV diode in the range of 80 kA per cm², which may cause the destruction of the semiconductor device, because these current or current density peaks are significantly reduced as illustrated in the following figures. The complementary-conducting transitional zone therefore causes a spreading of the reverse current in the current commutation process in this region. This results in smaller electric fields in this in this transition region, the improved current distribution resulting in a lower field strength.

Figure 3:
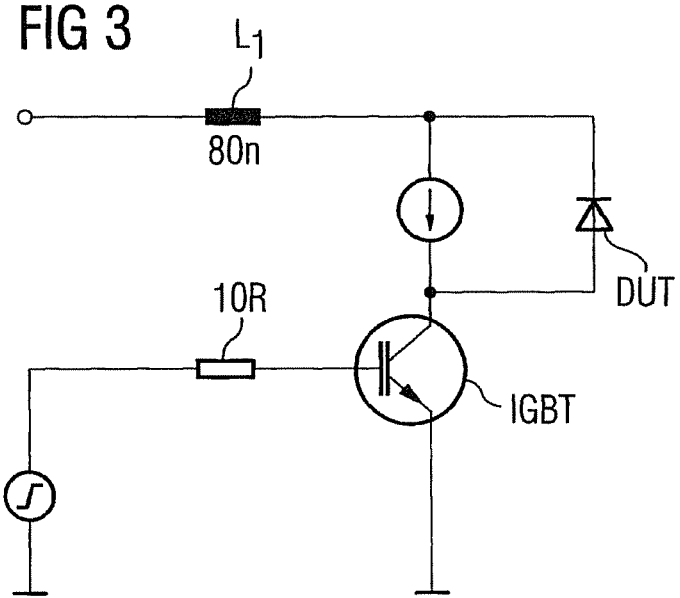
FIG. 3 illustrates a circuit structure for the simulation of a test device.

FIG. 3 illustrates a diagram of the circuit structure for a simulation of a semiconductor device to be tested by way of example. The test device in question is a free-wheeling diode identified as DUT (device under test). The circuit further includes a leakage inductance L to make the simulation and measurement as realistic as possible.

Figure 4:
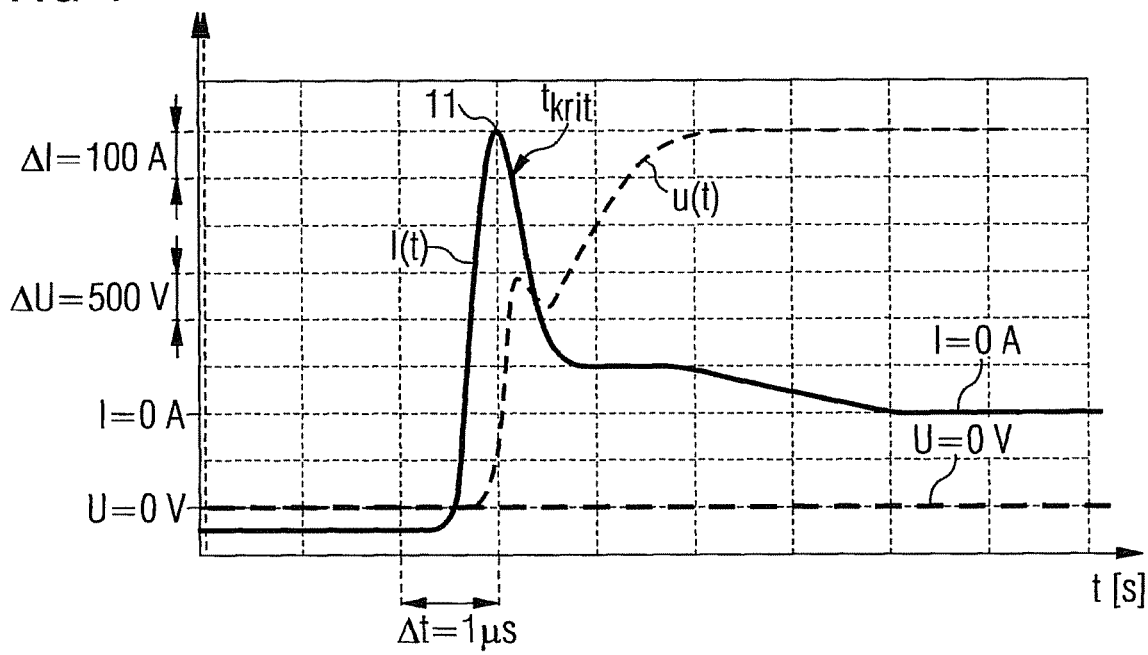
FIG. 4 diagrammatically illustrates the current and voltage curves versus time for a semiconductor device according to FIG. 1.

FIG. 4 diagrammatically illustrates the current I(t) and voltage U(t) curves versus time t for a semiconductor device 1 according to FIG. 1. These are simulated switching curves for current I(t) and voltage U(t) of the free-wheeling diode "DUT" illustrated in FIG. 3. A critical time $t_{krit}$ with the highest field strength in the semiconductor body immediately follows the overcurrent peak 11 and is indicated by an arrow in the switching curve for I(t). The time is plotted on the abscissa, each division corresponding to a Δt of one microsecond. On the ordinate, the continuous line indicates the current values in amps, each division corresponding to 100 A. The broken line indicates the voltage U(t) between the anode and the cathode of a free-wheeling diode or between source and drain of an MOS transistor or between collector and back side emitter in an IGBT transistor, each division corresponding to 500 V.

Figure 5A:
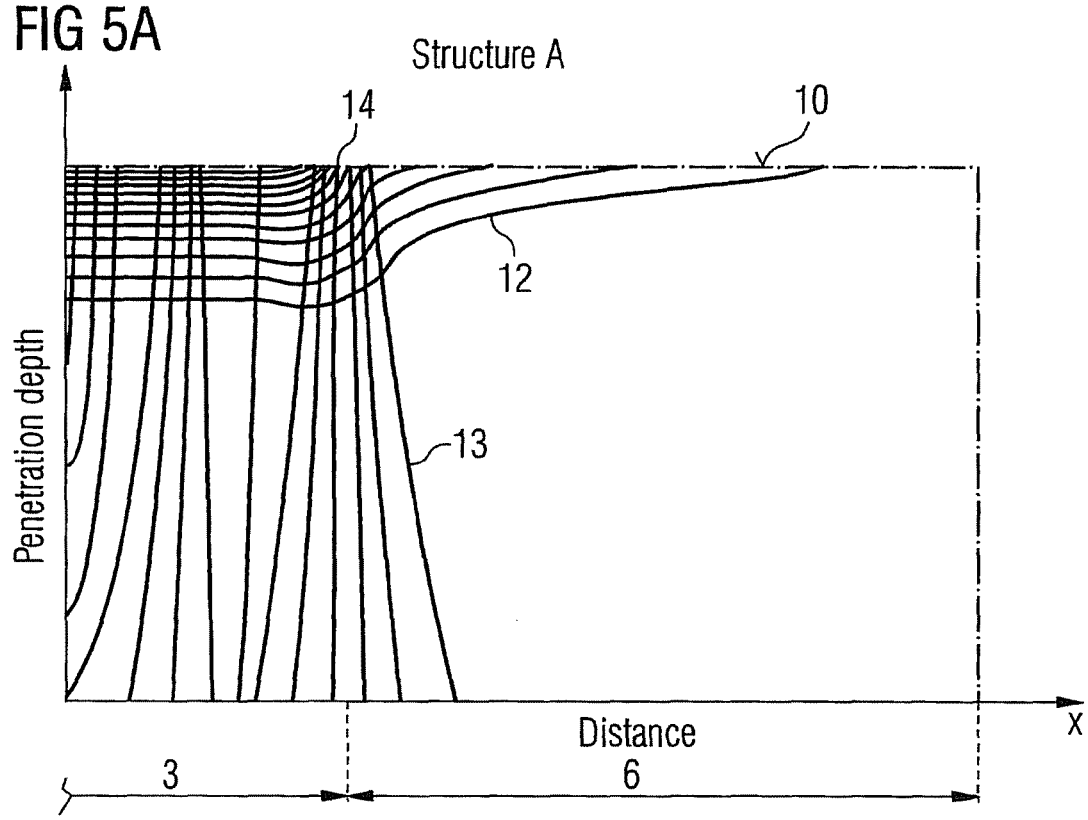
FIG. 5 diagrammatically compares the modes of operation in terms of potential and current lines in a semiconductor body of a semiconductor device.
Figure 5B:
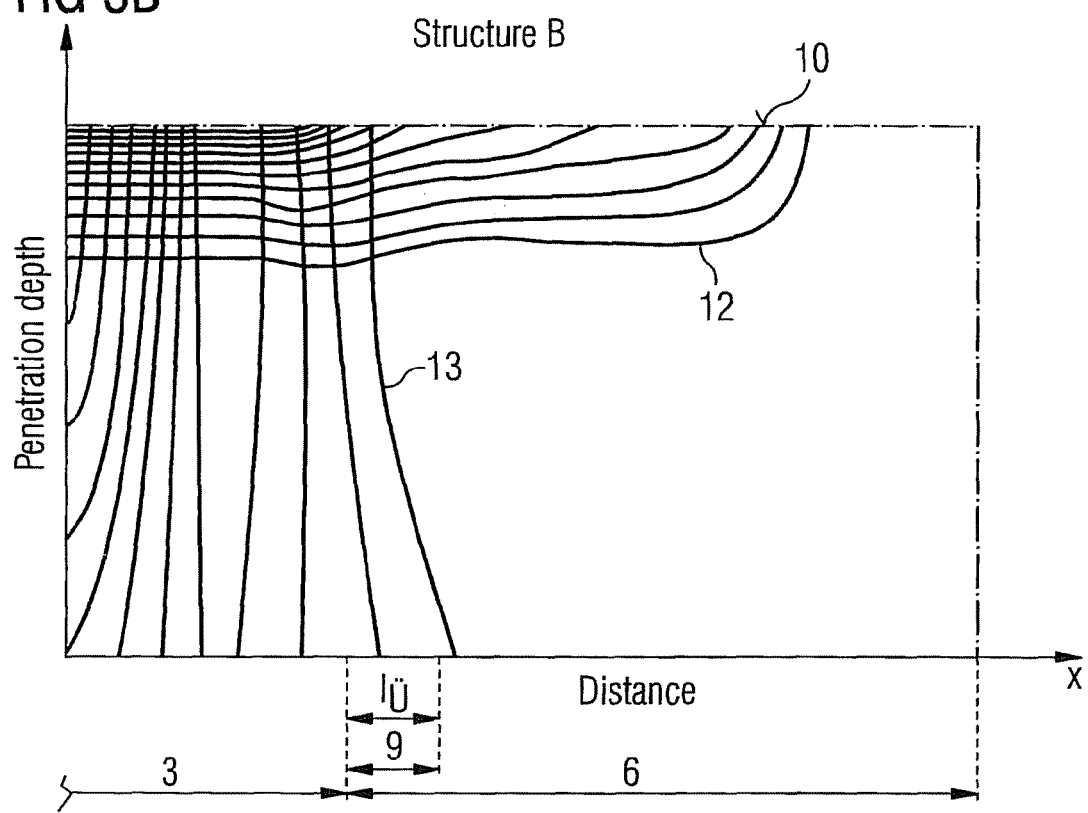

FIGS. 5A and 5B diagrammatically illustrate the modes of operation of the invention in terms of potential and current lines in a semiconductor body of a semiconductor device according to the invention. Structure A in FIG. 5A illustrates the equipotential lines 12 and the current density lines 13 at an abrupt transition from the impurity concentration of the p-type well to the impurity concentration of the VLD zone in accordance with previous stationary requirements for a semiconductor device. At the abrupt transition 14 between the p-type well and the VLD zone, the current lines 13 clearly accumulate at the critical time $t_{krit}$ illustrated in FIG. 4, and the equipotential lines 12 also illustrate a high density at this transition.

FIG. 5B illustrates the effect which can be achieved by using structure B and thus by using the invention compared to structure A; the current density lines 13 in the semiconductor body are now farther apart, and the equipotential lines are also spaced more widely, so that the field strength peaks at $t_{krit}$ are minimized.

Figure 6:
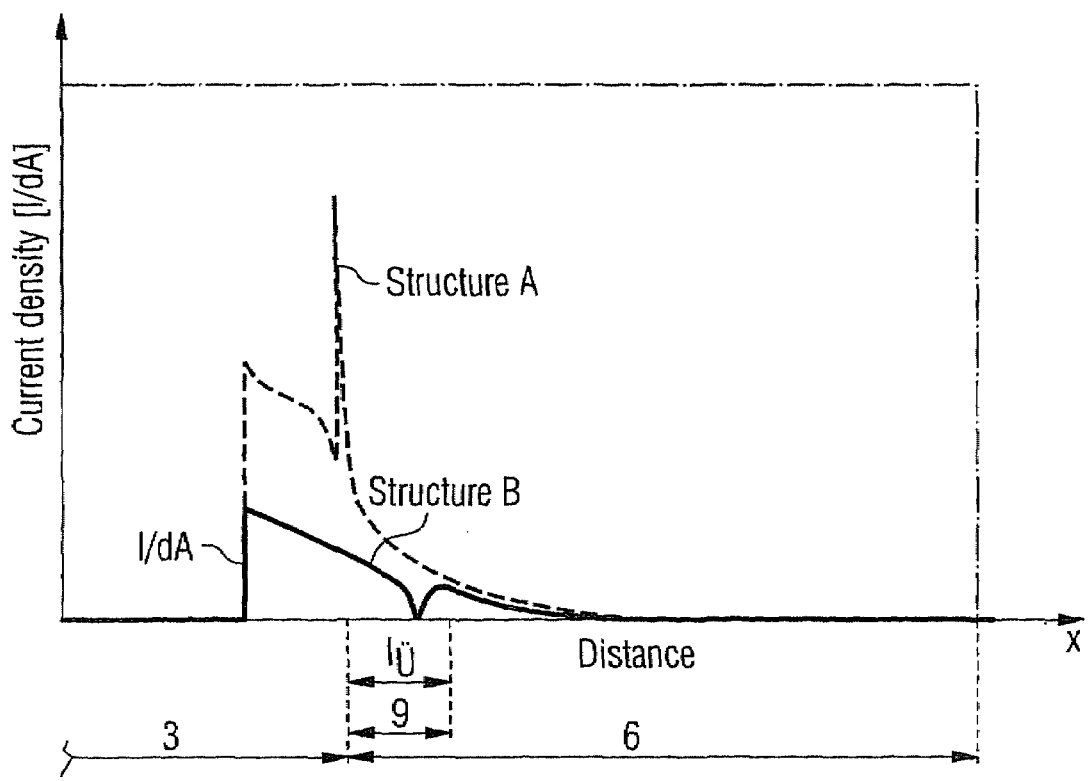
FIG. 6 diagrammatically compares the modes of operation in terms of current density on the semiconductor surface for a semiconductor device.

FIG. 6 diagrammatically compares the modes of operation in terms of the current density I/dA on the semiconductor surface for a semiconductor device according to the invention at the critical time $t_{krit}$ illustrated in FIG. 4; in the semiconductor device with the structure B according to the invention, the surface current density at the critical time $t_{krit}$ could be reduced to less than half.

Figure 7:
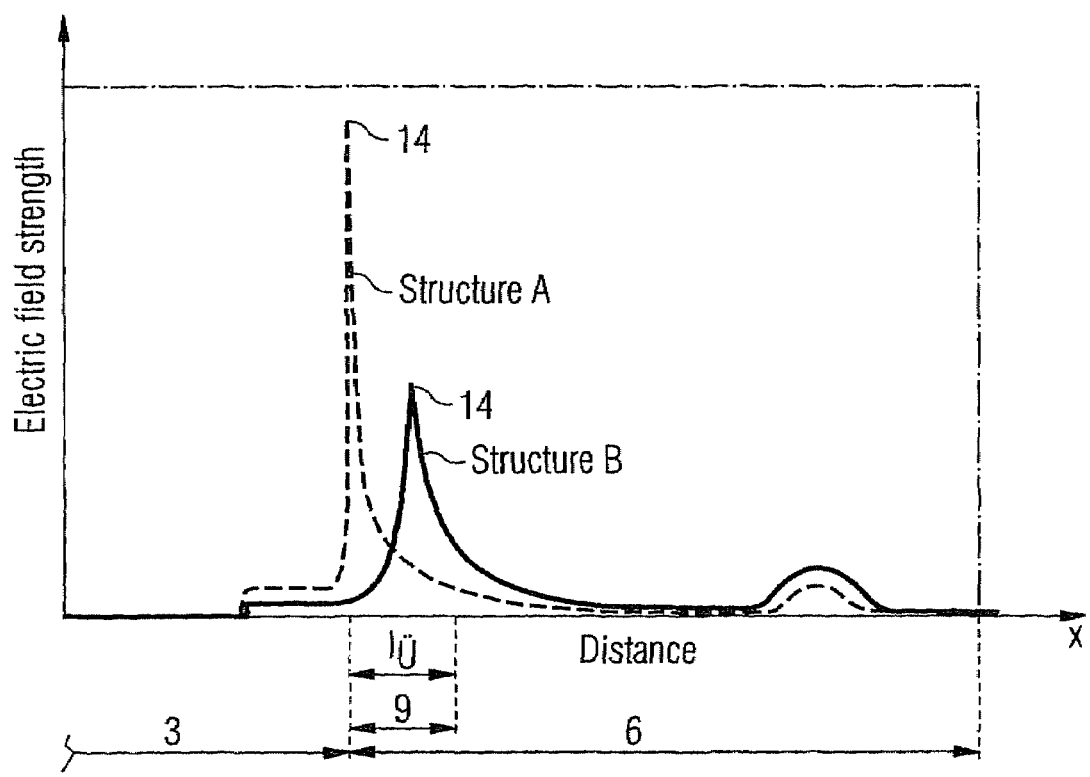
FIG. 7 diagrammatically compares the modes of operation in terms of electric field strength on the semiconductor surface for a semiconductor device.

The semiconductor device according to the invention also has an advantage to offer in terms of the weakening of the electric field strength as illustrated in FIG. 7. FIG. 7 diagrammatically compares the modes of operation in terms of electric field strength on the semiconductor surface for a semiconductor device according to the invention at the critical time $t_{krit}$ illustrated in FIG. 4. The field strength of structure B according to the invention is indicated by a continuous line, while the field strength of the known structure A is indicated by a broken line. Irrespective of dynamic switching behaviour, the critical field strength of the semiconductor device according to the invention is clearly reduced by more than half.

Apart from the critical time at the gating of a high-performance device, semiconductor devices of this type have a second critical point where there is a risk of increased density of the current lines, this being the contact hole edges. By suitable distancing of such contact hole edges from the edge of the p-type well, the increase of the electric field involved can be reduced below a critical value. The simulations of FIGS. 5A and 5B are based on a distance of 250 μm between the contact hole edge and the end of the homogeneous p-type region.

In addition to the illustrated simulations for an IGBT freewheeling diode, the design principle can obviously be applied to the active switch as well. The principle can generally be applied both to switched bipolar devices such as GTOs (gate turn-off transistors), IGBTs, RC (reverse conducting) and RB (reverse blocking) IGBTs and to MOS-controlled power transistors with or without compensation principle, wherein the integrated reverse diode is used for commutation as known in COOLMOS and DMOS transistors.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device with a semiconductor body, comprising:
    an active region with a vertical drift path of a first conduction type and with a near-surface lateral well of a second, complementary conduction type;
    an edge region surrounding the active region, with a variable lateral doping material zone of the second conduction type, which adjoins the well and the concentration of doping material of which is reduced to the concentration of the drift path towards a semiconductor chip edge;
    wherein a transition region in which the concentration of doping material continuously gradually decreases from the concentration of the well to the concentration at the start of the variable lateral doping material zone is located between the lateral well and the variable lateral doping material zone, the concentration of doping material of the transition region being equal to the concentration of the lateral well.

2. The semiconductor device of claim 1, wherein the concentration of doping material in the transition region is reduced by 1.5 to 6 powers of ten within a lateral length $l_{\ddot{U}}$.

3. A semiconductor device with a semiconductor body. comprising:
    an active region with a vertical drift path of a first conduction type and with a near-surface lateral well of a second, complementary conduction type;
    an edge region surrounding the active region, with a variable lateral doping material zone of the second conduction type. which adjoins the well and the concentration of doping material of which is reduced to the concentration of the drift path towards a semiconductor chip edge;
    wherein a transition region in which the concentration Of doping material gradually decreases from the concentration of the well to the concentration at the start of the variable lateral doping material zone is located between the lateral well and the variable lateral doping material zone;
    wherein the concentration of doping material in the transition region is reduced by 1.5 to 6 powers of ten within a lateral length $l_{\ddot{U}}$; and
    wherein the relationship between the lateral length $l_{\ddot{U}}$ of the transition region and the vertical length $l_D$ of the drift path is $0.1 \leq l_{\ddot{U}}/l_D \leq 0.5$.

4. The semiconductor device of claim 1, wherein the semiconductor device is a high-voltage power semiconductor device which has a compensation-free IGBT structure in the active region and is intended for dynamic switching processes.

5. The semiconductor device of claim 1, wherein the semiconductor device is a high-voltage power semiconductor device which has a compensation-free diode structure in the active region and is intended for dynamic switching processes.

* * * * *

UNITED STATES PATENT AND TRADEMARK OFFICE
CERTIFICATE OF CORRECTION

PATENT NO. : 7,880,260 B2
APPLICATION NO. : 12/107335
DATED : February 1, 2011
INVENTOR(S) : Elmar Falck et al.

It is certified that error appears in the above-identified patent and that said Letters Patent is hereby corrected as shown below:

Title Page, Item (73), Assignee name, delete "Infineon Technology Austria AG" and insert in place thereof --Infineon Technologies Austria AG--.

Column 6, line 38, delete "type. which" and insert in place thereof --type, which--.

Column 6, line 41, delete "concentration Of" and insert in place thereof --concentration of--.

Signed and Sealed this
Seventeenth Day of May, 2011

David J. Kappos
*Director of the United States Patent and Trademark Office*